United States Patent
Quax (10) Patent No.: US 12,316,107 B2
(45) Date of Patent: May 27, 2025

(54) SEMICONDUCTOR DEVICE WITH FAST TURN-ON ESD PROTECTION CIRCUIT AND METHOD THEREFOR

(71) Applicant: NXP B.V., Eindhoven (NL)

(72) Inventor: Guido Wouter Willem Quax, Wijchen (NL)

(73) Assignee: NXP B.V., Eindhoven (NL)

( * ) Notice: Subject to any disclaimer, the term of this patent is extended or adjusted under 35 U.S.C. 154(b) by 181 days.

(21) Appl. No.: 18/056,744

(22) Filed: Nov. 18, 2022

(65) Prior Publication Data

US 2024/0170959 A1 May 23, 2024

(51) Int. Cl.
  *H02H 9/00* (2006.01)
  *H02H 9/04* (2006.01)

(52) U.S. Cl.
  CPC .................. *H02H 9/046* (2013.01)

(58) Field of Classification Search
  CPC ... H02H 9/046; H01L 27/027; H01L 27/0262; H01L 27/0248; H03K 17/0403; H03K 17/0814
  USPC .................................................... 361/56, 111
  See application file for complete search history.

(56) References Cited

U.S. PATENT DOCUMENTS

| | | | |
|---|---|---|---|
| 5,452,171 A * | 9/1995 | Metz | H01L 27/0262 361/118 |
| 5,610,425 A | 3/1997 | Quigley et al. | |
| 6,498,357 B2 | 12/2002 | Ker et al. | |
| 6,618,233 B1 * | 9/2003 | Russ | H10D 89/713 361/111 |
| 6,777,721 B1 | 8/2004 | Huang et al. | |
| 6,919,604 B2 | 7/2005 | Lai et al. | |
| 7,566,595 B2 | 7/2009 | Steinhoff | |
| 8,587,071 B2 | 11/2013 | Tsai et al. | |
| 8,796,729 B2 | 8/2014 | Clarke et al. | |
| 9,177,952 B2 | 11/2015 | Zhan et al. | |
| 9,318,479 B2 | 4/2016 | Li et al. | |
| 9,704,850 B2 | 7/2017 | Quax et al. | |

(Continued)

FOREIGN PATENT DOCUMENTS

| | | |
|---|---|---|
| KR | 1020100089519 A | 8/2010 |
| KR | 1020150138938 A | 12/2015 |

OTHER PUBLICATIONS

Chen, C., "Optimization Design on Active Guard Ring to Improve Latch-Up Immunity of CMOS Integrated Circuits", IEEE Transactions on Electron Devices, vol. 66, Issue 4, Apr. 2019.

(Continued)

*Primary Examiner* — Jared Fureman
*Assistant Examiner* — Lucy M Thomas (57) ABSTRACT

An electrostatic discharge (ESD) protection circuit is provided. The ESD circuit includes a first transistor, a second transistor, and a silicon-controlled rectifier (SCR) circuit. The first transistor includes a first current electrode coupled at a first node, and a second current electrode and a control electrode coupled at a first voltage supply node. The second transistor includes a first current electrode, a second current electrode, and a control electrode. The control electrode of the second transistor is coupled at a body electrode of the first transistor. The SCR circuit includes an anode electrode coupled at the first node, a cathode electrode coupled at the first voltage supply node, and a trigger input coupled at the first current electrode of the second transistor.

20 Claims, 5 Drawing Sheets

(56) References Cited

U.S. PATENT DOCUMENTS

| | | | |
|---|---|---|---|
| 9,825,020 | B2 | 11/2017 | Besse et al. |
| 10,020,299 | B2 | 7/2018 | Lai |
| 10,170,476 | B2 | 1/2019 | Chapman et al. |
| 10,177,566 | B2 * | 1/2019 | Zhao .................. H01L 27/0262 |
| 10,361,185 | B2 | 7/2019 | Zhan et al. |
| 10,600,776 | B2 | 3/2020 | Lai |
| 10,826,290 | B2 | 11/2020 | De Raad et al. |
| 2002/0122280 | A1 | 9/2002 | Ker et al. |
| 2005/0275029 | A1 | 12/2005 | Watt |
| 2006/0097322 | A1 | 5/2006 | Kwak et al. |
| 2008/0144244 | A1 * | 6/2008 | Van Camp .......... H01L 27/0266 |
| | | | 257/E27.07 |
| 2010/0090283 | A1 | 4/2010 | Langguth et al. |
| 2010/0321840 | A1 * | 12/2010 | Bobde ................. H01L 27/0266 |
| | | | 257/143 |
| 2013/0114169 | A1 * | 5/2013 | Werner .................. H05B 45/54 |
| | | | 361/56 |
| 2013/0285111 | A1 | 10/2013 | Di Sarro et al. |
| 2017/0077082 | A1 * | 3/2017 | Marreiro ............ H01L 27/0262 |
| 2017/0278839 | A1 | 9/2017 | Lai |
| 2019/0198493 | A1 | 6/2019 | Lai et al. |
| 2020/0111778 | A1 | 4/2020 | Lai et al. |

OTHER PUBLICATIONS

Du., F., "Augmented DTSCR With Fast Turn-On Speed for Nanoscale ESD Protection Applications", IEEE Transactions on Electron Devices, vol. 67, No. 3, Mar. 2020.

Ker, M., "Native-NMOS-Triggered SCR With Faster Turn-On Speed for Effective ESD Protection in a 0.13-μm CMOS Process", IEEE Transactions on Device and Materials Reliability, vol. 5, No. 3, Sep. 2005.

Ker, M., "Overview of On-Chip Electrostatic Discharge Protection Design With SCR-Based Devices in CMOS Integrated Circuits", IEEE Transactions on Device and Materials Reliability, vol. 5, No. 2, Jun. 2005.

Lai, D., "DNW-Controllable Triggered Voltage of the Integrated Diode Triggered SCR (IDT-SCR) ESD Protection Device", 2017 39th Electrical Overstress/Electrostatic Discharge Symposium (EOS/ESD), Sep. 10-14, 2017.

Ma, F., "Comparison of different MOS-triggered SCR structures for on-chip ESD protection", 2011 3rd International Conference on Computer Research and Development, Mar. 11-13, 2011.

Sun, R., "Silicon-Controlled Rectifier for Electrostatic Discharge Protection Solutions With Minimal Snapback and Reduced Overshoot Voltage", IEEE Electron Device Letters, vol. 36, No. 5, May 2015.

* cited by examiner

SEMICONDUCTOR DEVICE WITH FAST TURN-ON ESD PROTECTION CIRCUIT AND METHOD THEREFOR

BACKGROUND

Field

This disclosure relates generally to electronic circuits, and more specifically, to a semiconductor device with a fast turn-on electrostatic discharge (ESD) protection circuit.

Related Art

Today, most sophisticated semiconductor devices incorporate circuitry configured ESD protection. For example, ESD protection circuits are commonly used in a variety of different applications and electronic products—from sewing machines to washing machines, from automobiles to cellular telephones, and so on. As process technology progresses, these semiconductor devices are expected to improve in reliability while increasing performance. However, challenges exist in balancing size, cost, performance, and long-term reliability.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a fast turn-on ESD protection circuit. The ESD protection circuit of a semiconductor device includes a grounded-gate NMOS transistor, an NMOS transistor, and a silicon-controlled rectifier circuit. The NMOS transistor is coupled between the grounded-gate NMOS transistor and the silicon-controlled rectifier circuit. The grounded-gate NMOS transistor is configured to generate an avalanche current during an ESD event. The avalanche current is routed through a resistor which generates a voltage sufficient to turn on the NMOS transistor. When turned on, the NMOS transistor is configured to pull down a trigger input of the silicon-controlled rectifier circuit causing a latching mechanism of the silicon-controlled rectifier circuit to activate. By triggering the latching mechanism of the silicon-controlled rectifier in this manner, the ESD protection circuit is much more responsive to an ESD event and therefore, capable of protecting even the most sensitive circuit elements of the semiconductor device.

Figure 1:
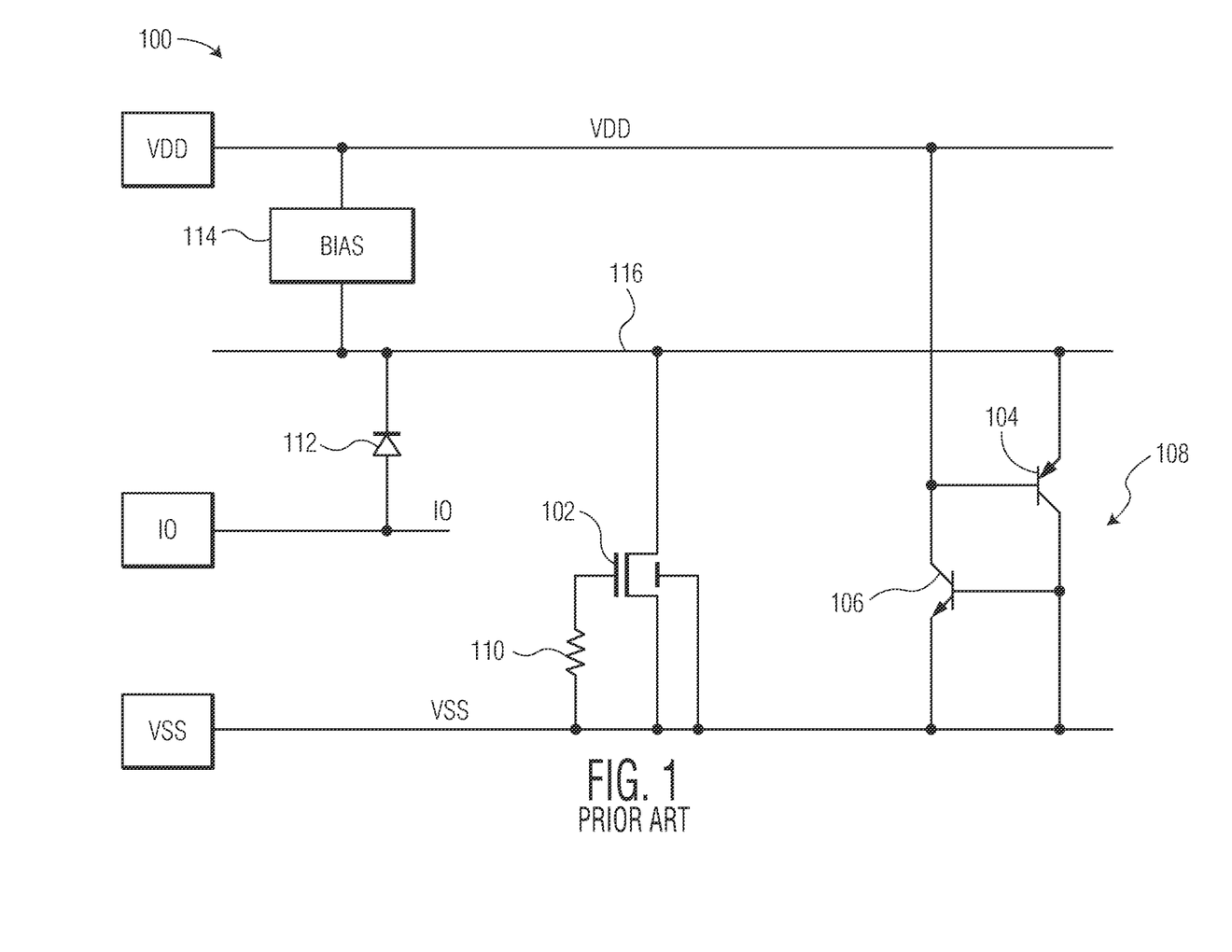
FIG. 1 illustrates, in a simplified schematic diagram form, a conventional ESD protection circuit.

FIG. 1 illustrates, in a simplified schematic diagram form, an example of a conventional ESD protection circuit 100. The ESD protection circuit 100 includes an NMOS transistor 102, a silicon-controlled rectifier circuit 108, an input diode 112, and a bias circuit 114. In this example, the NMOS transistor 102 is configured as a grounded-gate NMOS having a first current electrode connected at node 116, a second current electrode and body electrode connected to a VSS supply node, and a control electrode coupled to the VSS supply node by way of a resistor 110. The VSS supply node is connected at a pad labeled VSS.

The silicon-controlled rectifier circuit 108 includes a PNP transistor 104 and an NPN transistor 106 connected together. An emitter electrode of the transistor 104 is connected at node 116. A base electrode of the transistor 104 and a collector electrode of the transistor 106 are connected at a VDD supply node. A base electrode and an emitter electrode of the transistor 106 and a collector electrode of the transistor 104 are connected at the VSS supply node.

The input diode 112 has an anode electrode connected at an input/output (IO) signal line and a cathode electrode connected at the node 116. The IO signal line is connected at a pad labeled IO. The bias circuit 114 has an input connected at the VDD supply node and an output connected at the node 116. The VDD supply node is connected at a pad labeled VDD.

In operation, the NMOS transistor 102 of the conventional ESD protection circuit 100 provides a relatively high clamping voltage during an ESD event. The silicon-controlled rectifier circuit 108 is configured to compensate for the high clamping voltage of the NMOS transistor 102 by providing a lower clamping voltage but at the expense of a slower turn-on speed. It is therefore desirable to provide an ESD protection circuit which has a low clamping voltage and a fast turn-on speed.

Figure 2:
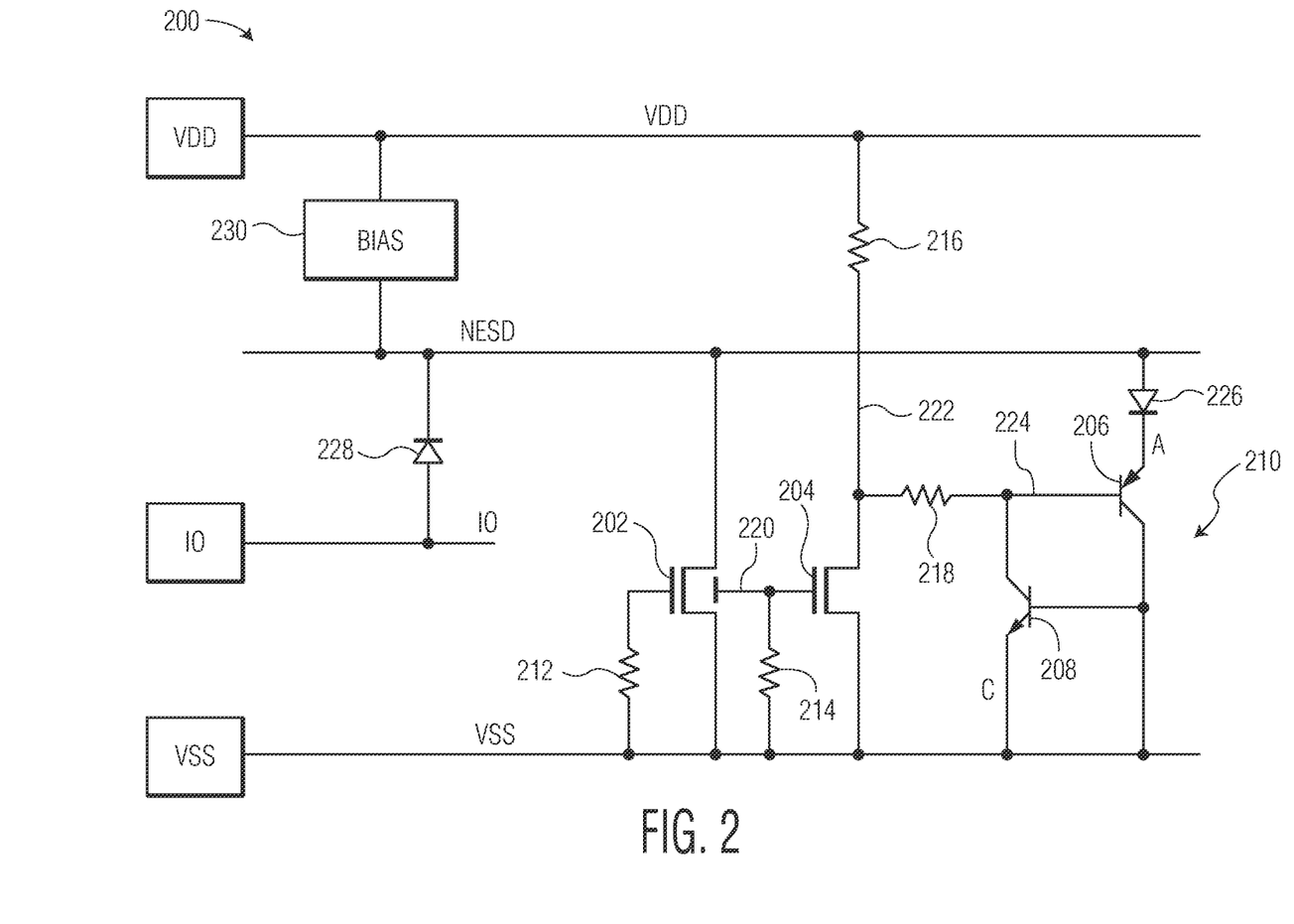
FIG. 2 illustrates, in a simplified schematic diagram form, an example fast turn-on ESD protection circuit in accordance with an embodiment.

FIG. 2 illustrates, in a simplified schematic diagram form, an example fast turn-on ESD protection circuit 200 in accordance with an embodiment. In this embodiment, the ESD protection circuit 200 includes a grounded-gate N-channel MOS (ggNMOS) transistor 202, an N-channel MOS (NMOS) transistor 204, a silicon-controlled rectifier (SCR) circuit 210, an input diode 226, and a bias circuit 228. A first voltage supply pad labeled VDD is connected at a voltage supply node labeled VDD and a second voltage supply pad labeled VSS is connected at a voltage supply node labeled VSS. In this embodiment, the VDD supply node is configured for supplying a positive operating voltage (e.g., ~3.3 volts at a 40 nm technology node) and the VSS supply node is configured for supplying a ground (e.g., zero volts) voltage. In other embodiments, the VDD supply node is configured for supplying positive operating voltages consistent with other technology nodes. An input/output pad labeled IO is connected at an input/output signal line node labeled IO. The IO pad and node may be configured to accommodate input only signals, output only signals, as well as and input and output (e.g., bidirectional) signals. Features which may be coupled at the IO pad and IO node such as an input buffer, an output buffer, and other ESD protection structures are not shown for illustration purposes.

In this embodiment, the ggNMOS transistor 202 includes a control electrode coupled at the voltage supply node labeled VSS. The control electrode of the ggNMOS transistor 202 is coupled at the VSS supply node by way of a resistor 212 having a first terminal connected at the control electrode of the ggNMOS transistor 202 and a second terminal connected at the VSS supply node. In this embodiment, the resistor 212 may be formed having a resistance value in a range of approximately 1 k ohms to 50 k ohms. A first current electrode of the ggNMOS transistor 202 is connected at an ESD rail node labeled NESD. In this embodiment, the NESD rail serves as a localized node coupled to ESD structures such as the ggNMOS transistor 202 and the SCR circuit 210. A second current electrode of the ggNMOS transistor 202 is connected at the VSS supply node and a body electrode of the ggNMOS transistor 202 is connected at node 220. In this embodiment, the ggNMOS transistor 202 may be subjected to a large amount of energy during an ESD event. Accordingly, the ggNMOS transistor 202 may be formed as a large transistor having a thicker gate oxide and longer channel length (e.g., when compared with typical logic transistors in a common technology node).

The NMOS transistor 204 includes a control electrode connected to the body electrode of the ggNMOS transistor 202 at node 220. The control electrode of the NMOS transistor 204 and the body electrode of the ggNMOS transistor 202 are coupled at the VSS supply node by way of a resistor 214. A first terminal of the resistor 214 is connected at node 220 and a second terminal of the resistor 214 is connected at the VSS supply node. In this embodiment, the resistor 214 may be formed having a resistance value in a range of approximately 500 ohms to 15 k ohms. A first current electrode of the NMOS transistor 204 is coupled at the voltage supply node labeled VDD. The first current electrode of the NMOS transistor 204 is coupled at the VDD supply node by way of a resistor 216 having a first terminal connected to the first current electrode at node 222 and a second terminal connected at the VDD supply node. In this embodiment, the resistor 216 may be formed having a resistance value in a range of approximately 5 k ohms to 30 k ohms. A second current electrode of the NMOS transistor 204 is connected at the VSS supply node.

The SCR circuit 210 includes a PNP bipolar junction transistor (BJT) 206 portion and an NPN BJT 208 portion. A base electrode (e.g., formed as an N-well region) of the PNP BJT 206 is connected to a collector electrode of the NPN BJT 208 at node 224. The base electrode of the PNP BJT 206 and the collector electrode of the NPN BJT 208 are coupled at node 222 by way of a resistor 218. A first terminal of the resistor 218 is connected at node 222 and a second terminal of the resistor 218 is connected at node 224. In this embodiment, the resistor 218 may be formed having a resistance value in a range of approximately 200 ohms to 1 k ohms. A base electrode (e.g., formed as a P-well region) of the NPN BJT 208, an emitter electrode of the NPN BJT 208, and a collector electrode of the PNP BJT 206 are connected at the VSS supply node. An emitter electrode of the PNP BJT 206 is coupled at the NESD node by way of a diode 226. An anode electrode of the diode 226 is connected at the NESD node and a cathode electrode of the diode 226 is connected at the emitter electrode of the PNP BJT 206. In this embodiment, the emitter electrode of the PNP BJT 206 is configured to serve as an anode terminal (labeled A) of the SCR 210, the emitter electrode of the NPN BJT 208 is configured to serve as a cathode terminal (labeled C) of the SCR 210, and the node 224 connected to the N-well base electrode of the PNP BJT 206 is configured to serve as a trigger input of the SCR 210.

The ESD protection circuit 200 further includes an input diode 228 and a bias circuit 230. An anode electrode of the diode 228 is connected at the node labeled IO and a cathode electrode of the diode 228 is connected at the NESD node. In this embodiment, the diode 228 may be characterized as an ESD diode configured to be subjected to large amount of energy during an ESD event. The bias circuit 230 includes an input connected at the VDD supply node and an output connected at the NESD node. The bias circuit is configured to provide a bias voltage at the NESD node. Example bias circuits of the ESD protection circuit 200 are depicted in FIG. 3 and FIG. 4.

In this embodiment, the ggNMOS transistor 202 of the ESD protection circuit 200 is configured to go into an avalanche breakdown mode in response to an ESD event thus generating an avalanche current through the resistor 214. The avalanche current through the resistor 214 causes the voltage at node 220 (e.g., gate voltage of NMOS transistor 204) to increase. The NMOS transistor 204 of the ESD protection circuit 200 is configured to conduct or turn-on based on the voltage at node 220. In response to the increasing voltage at node 220, the NMOS transistor 204 begins to conduct causing the node 222 to be pulled down. The SCR circuit 210 of the ESD protection circuit 200 is configured to trigger when the node 224 (e.g., N-well base electrode of PNP transistor 206) reaches a trigger threshold voltage (e.g., a predetermined voltage at node 224 lower than the voltage at the anode electrode). With the node 222 being pulled down by the NMOS transistor 204, the voltage at node 224 drops below the trigger threshold causing the SCR circuit 210 to engage an SCR latching mechanism. By triggering the SCR circuit 210 in this manner, the latching mechanism of the SCR circuit is initiated very quickly thus allowing the overall response of the ESD protection circuit 200 to outperform conventional SCR-based ESD protection circuitry.

Figure 3:
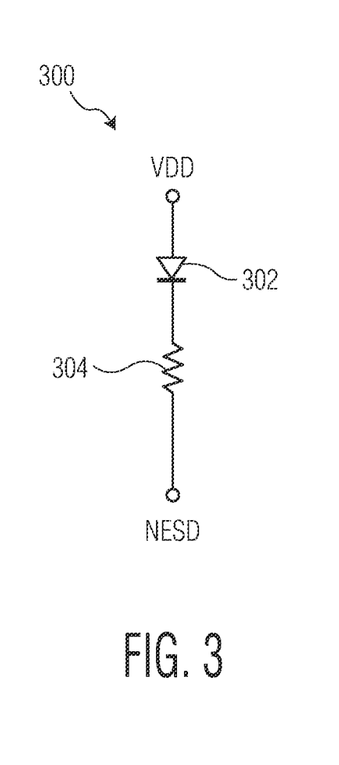
FIG. 3 and FIG. 4 illustrate, in simplified schematic diagram form, example bias circuits of the ESD protection circuit in accordance with an embodiment.

FIG. 3 illustrates, in a simplified schematic diagram form, an example bias circuit 300 of the ESD protection circuit 200 in accordance with an embodiment. The example bias circuit 300 depicted in FIG. 3 corresponds to the bias circuit 230 depicted in FIG. 2, for example. In this embodiment, the bias circuit 300 includes a diode 302 and resistor 304 connected in series between a VDD supply node terminal and an NESD node terminal. An anode electrode of the diode 302 is connected at the VDD supply node terminal and a cathode electrode of the diode 302 is connected at a first terminal of the resistor 304. A second terminal of the resistor 304 is connected at the NESD node terminal. In this embodiment, the bias circuit 300 is configured to provide a bias voltage approximately equal to the VDD supply node voltage minus a threshold voltage of the diode during normal operation.

Figure 4:
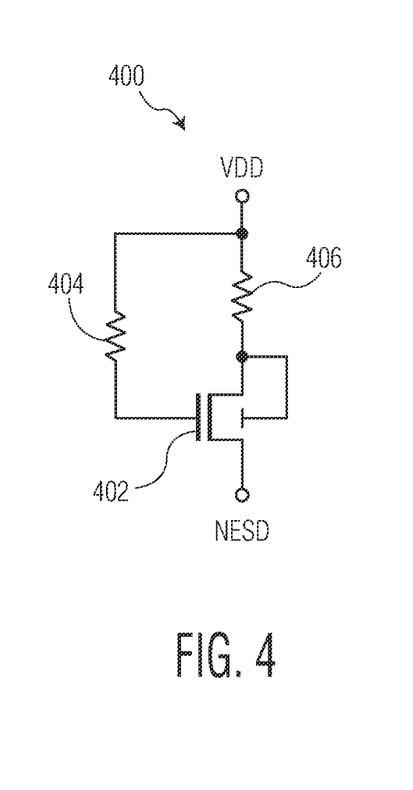

FIG. 4 illustrates, in a simplified schematic diagram form, another example bias circuit 400 of the ESD protection circuit 200 in accordance with an embodiment. The example bias circuit 400 depicted in FIG. 4 corresponds to the bias circuit 230 depicted in FIG. 2, for example. In this embodiment, the bias circuit 400 includes an NMOS transistor 402 and resistors 404 and 406 connected in diode configuration between a VDD supply node terminal and an NESD node terminal. A control electrode (e.g., gate) of the NMOS transistor 402 is connected at a first terminal of the resistor 404 and a second terminal of the resistor 404 is connected at the VDD supply node terminal. A first current electrode (e.g., source) of the NMOS transistor 402 is connected at a first terminal of the resistor 406 and a second terminal of the resistor 406 is connected at the VDD supply node terminal. A second current electrode (e.g., drain) is connected at the NESD node terminal. In this embodiment, the bias circuit 400 is configured to provide a bias voltage approximately equal to the VDD supply node voltage minus a threshold voltage of the diode during normal operation.

Figure 5:
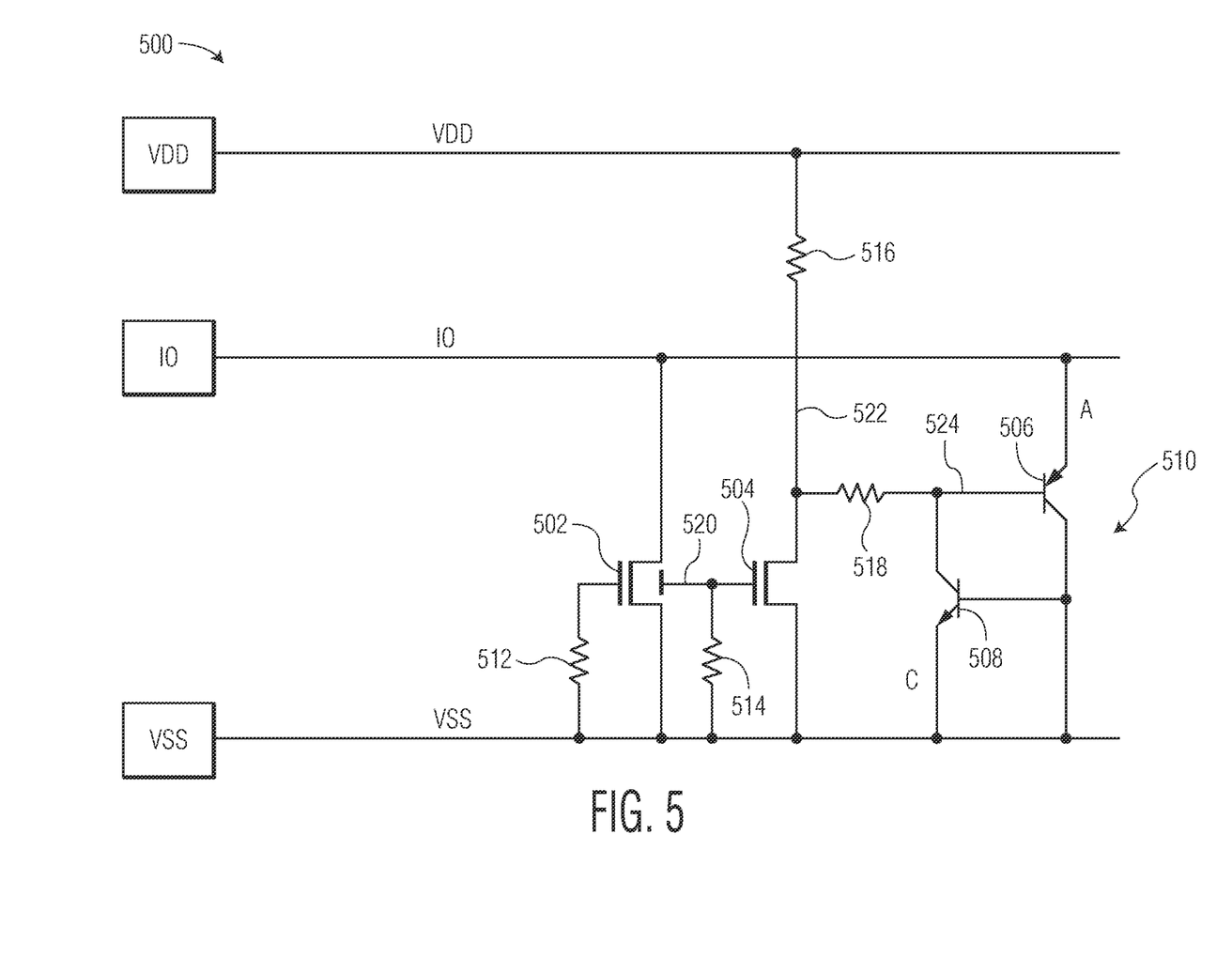
FIG. 5 illustrates, in a simplified schematic diagram form, an alternative example fast turn-on ESD protection circuit in accordance with an embodiment.

FIG. 5 illustrates, in a simplified schematic diagram form, an alternative example fast turn-on ESD protection circuit 500 in accordance with an embodiment. In this embodiment, the ESD protection circuit 500 includes a grounded-gate N-channel MOS (ggNMOS) transistor 502, an N-channel MOS (NMOS) transistor 504, and a silicon-controlled rectifier (SCR) circuit 510. A first voltage supply pad labeled VDD is connected at a voltage supply node labeled VDD and a second voltage supply pad labeled VSS is connected at a voltage supply node labeled VSS. In this embodiment, the VDD supply node is configured for supplying a positive operating voltage (e.g., ~3.3 volts at a 40 nm technology node) and the VSS supply node is configured for supplying a ground (e.g., zero volts) voltage. In other embodiments, the VDD supply node is configured for supplying positive operating voltages consistent with other technology nodes. An input/output pad labeled IO is connected at an input/output signal line node labeled IO. The IO pad and IO node may be configured to accommodate input only signals, output only signals, as well as and input and output (e.g., bidirectional) signals. Features which may be coupled at the IO pad and IO node such as an input buffer, an output buffer, and other ESD protection structures are not shown for illustration purposes.

In this embodiment, the ggNMOS transistor 502 includes a control electrode coupled at the voltage supply node labeled VSS. The control electrode of the ggNMOS transistor 502 is coupled at the VSS supply node by way of a resistor 512 having a first terminal connected at the control electrode of the ggNMOS transistor 502 and a second terminal connected at the VSS supply node. In this embodiment, the resistor 512 may be formed having a resistance value in a range of approximately 1 k ohms to 50 k ohms. A first current electrode of the ggNMOS transistor 502 is connected at the input/output signal line node labeled IO. A second current electrode of the ggNMOS transistor 502 is connected at the VSS supply node and a body electrode of the ggNMOS transistor 502 is connected at node 520. In this embodiment, the ggNMOS transistor 502 may be subjected to large amount of energy during an ESD event. Accordingly, the ggNMOS transistor 502 may be formed having a thicker gate oxide and longer channel length (e.g., when compared with typical logic transistors in a common technology node).

The NMOS transistor 504 includes a control electrode connected to the body electrode of the ggNMOS transistor 502 at node 520. The control electrode of the NMOS transistor 504 and the body electrode of the ggNMOS transistor 502 are coupled at the VSS supply node by way of a resistor 514. A first terminal of the resistor 514 is connected at node 520 and a second terminal of the resistor 514 is connected at the VSS supply node. In this embodiment, the resistor 514 may be formed having a resistance value in a range of approximately 500 ohms to 15 k ohms. A first current electrode of the NMOS transistor 504 is coupled at the voltage supply node labeled VDD. The first current electrode of the NMOS transistor 504 is coupled at the VDD supply node by way of a resistor 516 having a first terminal connected to the first current electrode at node 522 and a second terminal connected at the VDD supply node. In this embodiment, the resistor 516 may be formed having a resistance value in a range of approximately 5 k ohms to 30 k ohms. A second current electrode of the NMOS transistor 504 is connected at the VSS supply node.

The SCR circuit 510 includes a PNP bipolar junction transistor (BJT) 506 portion and an NPN BJT 508 portion. A base electrode (e.g., formed as an N-well region) of the PNP BJT 506 is connected to a collector electrode of the NPN BJT 508 at node 524. The base electrode of the PNP BJT 506 and the collector electrode of the NPN BJT 508 are coupled at node 522 by way of a resistor 518. A first terminal of the resistor 518 is connected at node 522 and a second terminal of the resistor 518 is connected at node 524. In this embodiment, the resistor 518 may be formed having a resistance value in a range of approximately 200 ohms to 1 k ohms. A base electrode (e.g., formed as a P-well region) of the NPN BJT 508, an emitter electrode of the NPN BJT 508, and a collector electrode of the PNP BJT 506 are connected at the VSS supply node. An emitter electrode of the PNP BJT 506 is connected at the IO node. In this embodiment, the emitter electrode of the PNP BJT 506 is configured to serve as an anode terminal (labeled A) of the SCR 510, the emitter electrode of the NPN BJT 508 is configured to serve as a cathode terminal (labeled C) of the SCR 510, and the node 524 connected to the N-well base electrode of the PNP BJT 506 is configured to serve as a trigger input of the SCR 510.

In this embodiment, the ggNMOS transistor 502 of the ESD protection circuit 500 is configured to go into an avalanche breakdown mode in response to an ESD event thus generating an avalanche current through the resistor 514. The avalanche current through the resistor 514 causes the voltage at node 520 to increase. The NMOS transistor 504 of the ESD protection circuit 500 is configured to conduct or turn-on based on the voltage at node 520. In response to the increasing voltage at node 520, the NMOS transistor 504 begins to conduct causing the node 522 to be pulled down. The SCR circuit 510 of the ESD protection circuit 500 is configured to trigger when the node 524 reaches the trigger threshold voltage. With the node 522 being pulled down by the NMOS transistor 504, the voltage at node 524 drops below the trigger threshold causing the SCR circuit 510 to engage an SCR latching mechanism.

Figure 6:
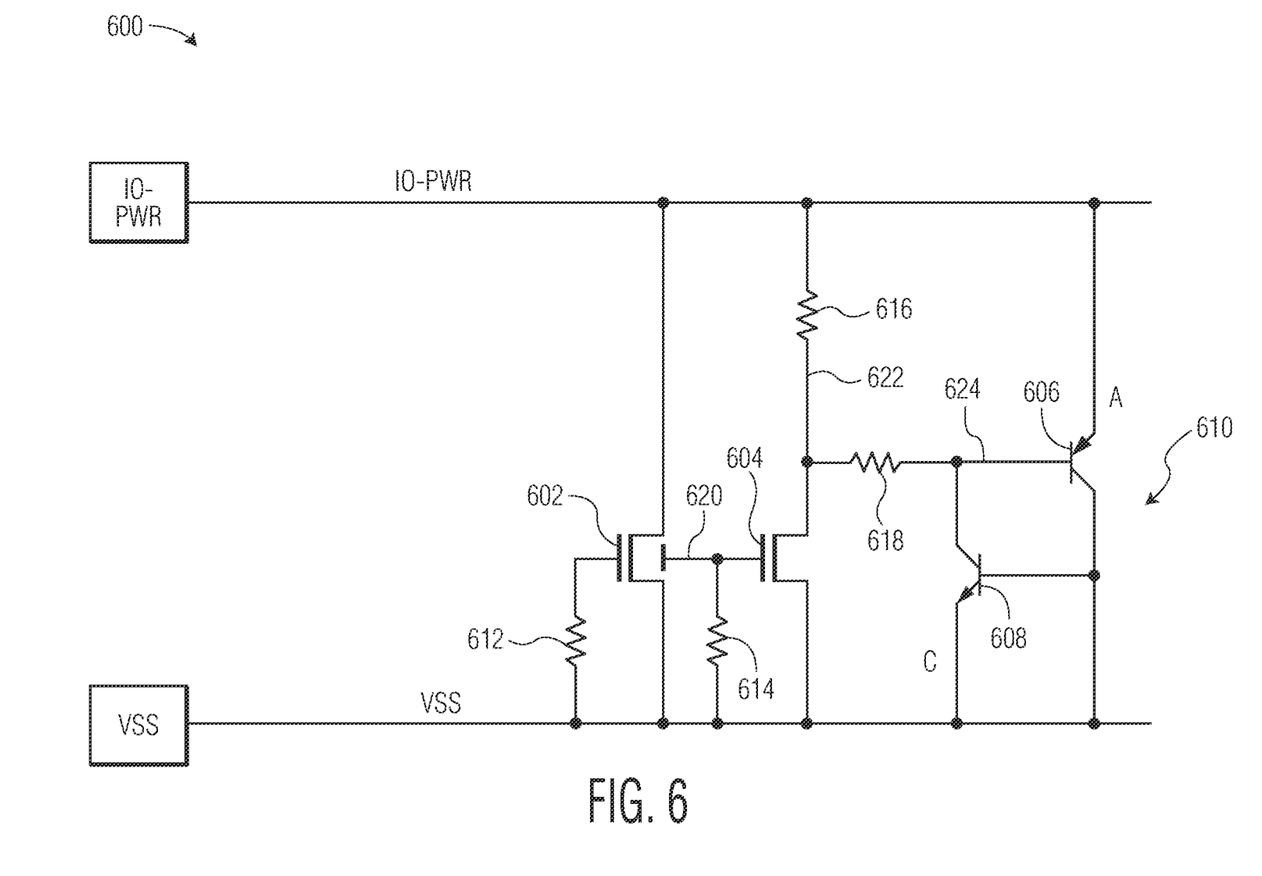
FIG. 6 illustrates, in a simplified schematic diagram form, another alternative example fast turn-on ESD protection circuits in accordance with an embodiment.

FIG. 6 illustrates, in a simplified schematic diagram form, an alternative example fast turn-on ESD protection circuit 600 in accordance with an embodiment. In this embodiment, the ESD protection circuit 600 includes a grounded-gate N-channel MOS (ggNMOS) transistor 602, an N-channel MOS (NMOS) transistor 604, and a silicon-controlled rectifier (SCR) circuit 610. A first voltage supply pad labeled VDD is connected at a voltage supply node labeled VDD and a second voltage supply pad labeled VSS is connected at a voltage supply node labeled VSS. In this embodiment, the VDD supply node is configured for supplying a positive operating voltage (e.g., ~3.3 volts at a 40 nm technology node) and the VSS supply node is configured for supplying a ground (e.g., zero volts) voltage. In other embodiments, the VDD supply node is configured for supplying positive operating voltages consistent with other technology nodes. A pad labeled IO-PWR is connected at an input/output signal line or power supply node labeled IO-PWR. The IO-PWR pad and IO-PWR node may be configured to accommodate input only signals, output only signals, as well as input and output (e.g., bidirectional) signals. Or the IO-PWR pad and IO-PWR node may be configured to supply a voltage such as an operating voltage, reference, voltage, ground voltage, etc. Features which may be coupled at the IO-PWR pad and IO-PWR node such as an input buffer, an output buffer, and other ESD protection structures are not shown for illustration purposes.

In this embodiment, the ggNMOS transistor 602 includes a control electrode coupled at the voltage supply node labeled VSS. The control electrode of the ggNMOS transistor 602 is coupled at the VSS supply node by way of a resistor 612 having a first terminal connected at the control electrode of the ggNMOS transistor 602 and a second terminal connected at the VSS supply node. In this embodiment, the resistor 612 may be formed having a resistance value in a range of approximately 1 k ohms to 50 k ohms. A first current electrode of the ggNMOS transistor 602 is connected at the node labeled IO-PWR. A second current electrode of the ggNMOS transistor 602 is connected at the VSS supply node and a body electrode of the ggNMOS transistor 602 is connected at node 620. In this embodiment, the ggNMOS transistor 602 may be subjected to large amount of energy during an ESD event. Accordingly, the ggNMOS transistor 602 may be formed having a thicker gate oxide and longer channel length (e.g., when compared with typical logic transistors in a common technology node).

The NMOS transistor 604 includes a control electrode connected to the body electrode of the ggNMOS transistor 602 at node 620. The control electrode of the NMOS transistor 604 and the body electrode of the ggNMOS transistor 602 are coupled at the VSS supply node by way of a resistor 614. A first terminal of the resistor 614 is connected at node 620 and a second terminal of the resistor 614 is connected at the VSS supply node. In this embodiment, the resistor 614 may be formed having a resistance value in a range of approximately 500 ohms to 15 k ohms. A first current electrode of the NMOS transistor 604 is coupled at the voltage supply node labeled VDD. The first current electrode of the NMOS transistor 604 is coupled at the IO-PWR node by way of a resistor 616 having a first terminal connected to the first current electrode at node 622 and a second terminal connected at the IO-PWR node. In this embodiment, the resistor 616 may be formed having a resistance value in a range of approximately 5 k ohms to 30 k ohms. A second current electrode of the NMOS transistor 604 is connected at the VSS supply node.

The SCR circuit 610 includes a PNP bipolar junction transistor (BJT) 606 portion and an NPN BJT 608 portion. A base electrode (e.g., formed as an N-well region) of the PNP BJT 606 is connected to a collector electrode of the NPN BJT 608 at node 624. The base electrode of the PNP BJT 606 and the collector electrode of the NPN BJT 608 are coupled at node 622 by way of a resistor 618. A first terminal of the resistor 618 is connected at node 622 and a second terminal of the resistor 618 is connected at node 624. In this embodiment, the resistor 618 may be formed having a resistance value in a range of approximately 200 ohms to 1 k ohms. A base electrode (e.g., formed as a P-well region) of the NPN BJT 608, an emitter electrode of the NPN BJT 608, and a collector electrode of the PNP BJT 606 are connected at the VSS supply node. An emitter electrode of the PNP BJT 606 is connected at the IO-PWR node. In this embodiment, the emitter electrode of the PNP BJT 606 is configured to serve as an anode terminal (labeled A) of the SCR 610, the emitter electrode of the NPN BJT 608 is configured to serve as a cathode terminal (labeled C) of the SCR 610, and the node 624 connected to the N-well base electrode of the PNP BJT 606 is configured to serve as a trigger input of the SCR 610.

In this embodiment, the ggNMOS transistor 602 of the ESD protection circuit 600 is configured to go into an avalanche breakdown mode in response to an ESD event thus generating an avalanche current through the resistor 614. The avalanche current through the resistor 614 causes the voltage at node 620 to increase. The NMOS transistor 604 of the ESD protection circuit 600 is configured to conduct or turn-on based on the voltage at node 620. In response to the increasing voltage at node 620, the NMOS transistor 604 begins to conduct causing the node 622 to be pulled down. The SCR circuit 610 of the ESD protection circuit 600 is configured to trigger when the node 624 reaches the trigger threshold voltage. With the node 622 being pulled down by the NMOS transistor 604, the voltage at node 624 drops below the trigger threshold causing the SCR circuit 610 to engage an SCR latching mechanism.

Generally, there is provided, an electrostatic discharge (ESD) protection circuit including a first transistor having a first current electrode coupled at a first node, a second current electrode, and a control electrode, the second current electrode and the control electrode coupled at a first voltage supply node; a second transistor having a first current electrode, a second current electrode, and a control electrode, the control electrode coupled at a body electrode of the first transistor; and a silicon-controlled rectifier (SCR) circuit having an anode electrode coupled at the first node, a cathode electrode coupled at the first voltage supply node, and a trigger input of the SCR circuit coupled at the first current electrode of the second transistor. The circuit may further include a diode having an anode electrode coupled at an input/output signal line and a cathode electrode coupled at the first node. The control electrode of the first transistor may be coupled at the first voltage supply node by way of a first resistor. The body electrode of the first transistor and the control electrode of the first transistor may be coupled at the first voltage supply node by way of a second resistor. The trigger input of the SCR circuit may be coupled at the first current electrode of the second transistor by way of a third resistor. The first current electrode of the second transistor may be coupled at a second voltage supply node by way of a fourth resistor. The circuit may further include a bias circuit coupled between the second voltage supply node and the first node. The first transistor may be configured to cause the second transistor to turn on the during an ESD event. The second transistor may be configured to conduct when turned on during the ESD event and cause the SCR circuit to trigger.

In another embodiment, there is provided, an electrostatic discharge (ESD) protection circuit including a first transistor having a first current electrode coupled at a first node, a second current electrode, and a control electrode, the second current electrode and the control electrode coupled at a first voltage supply node; a second transistor having a first current electrode, a second current electrode, and a control electrode, the control electrode coupled at a body electrode of the first transistor; a first bipolar junction transistor (BJT) having an emitter electrode coupled at the first node, a collector electrode coupled at the first voltage supply node, and a base electrode coupled at the first current electrode of the second transistor; and a second BJT having a collector electrode coupled at the base electrode of the first BJT, an emitter electrode and a base electrode of the second BJT coupled at the first voltage supply node. The base electrode may be coupled at the first current electrode of the second transistor by way of a resistor. The circuit may further include a resistor having a first terminal coupled at the first current electrode of the second transistor and a second terminal coupled at the first node or a second voltage supply node. The circuit may further include a resistor having a first terminal coupled at the first voltage supply node and a second terminal coupled at the control electrode of the second transistor. The first BJT and the second BJT may be configured to form a silicon-controlled rectifier (SCR) circuit, and wherein the base electrode of the first BJT is characterized as a trigger input of the SCR circuit. The second transistor may be configured to turn on in response to an ESD event and cause the SCR circuit to trigger by way of the trigger input.

In yet another embodiment, there is provided, an electrostatic discharge (ESD) protection circuit including a first transistor having a first current electrode coupled at a first node, a second current electrode coupled at a first voltage supply node, and a control electrode coupled at the first voltage supply node by way of a first resistor; a second transistor having a first current electrode, a second current electrode, and a control electrode, the control electrode coupled at a body electrode of the first transistor; a second resistor having a first terminal coupled at the first voltage supply node and a second terminal coupled at the control electrode of the second transistor; and a silicon-controlled rectifier (SCR) circuit having an anode electrode coupled at the first node, a cathode electrode coupled at the first voltage supply node, and a trigger input of the SCR circuit coupled at the first current electrode of the second transistor. The circuit may further include a diode having an anode electrode coupled at an input/output signal line and a cathode electrode coupled at the first node. The circuit may further include a bias circuit coupled between a second voltage supply node and the first node. The circuit may further include a third resistor having a first terminal coupled at the first current electrode of the second transistor and a second terminal coupled at the second voltage supply node. The second transistor may be configured to turn on in response to an ESD event and wherein the SCR circuit is configured to trigger based on the response of the second transistor.

By now it should be appreciated that there has been provided, a fast turn-on ESD protection circuit. The ESD protection circuit includes a grounded-gate NMOS transistor, an NMOS transistor, and a silicon-controlled rectifier circuit. The NMOS transistor is coupled between the grounded-gate NMOS transistor and the silicon-controlled rectifier circuit. The grounded-gate NMOS transistor is configured to generate an avalanche current during an ESD event. The avalanche current is routed through a resistor which generates a voltage sufficient to turn on the NMOS transistor. When turned on, the NMOS transistor is configured to pull down a trigger input of the silicon-controlled rectifier circuit causing a latching mechanism of the silicon-controlled rectifier circuit to activate. By triggering the latching mechanism of the silicon-controlled rectifier in this manner, the ESD protection circuit is much more responsive to an ESD event and therefore, capable of protecting even the most sensitive circuit elements of the semiconductor device.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An electrostatic discharge (ESD) protection circuit comprising:
   a first transistor having a first current electrode coupled at a first node, a second current electrode, and a control electrode, the second current electrode and the control electrode coupled at a first voltage supply node;
   a second transistor having a first current electrode, a second current electrode, and a control electrode, the control electrode coupled at a body electrode of the first transistor;
   a first diode having an anode electrode coupled at the first node and a cathode electrode; and
   a silicon-controlled rectifier (SCR) circuit having an anode electrode coupled at the cathode electrode of the first diode, a cathode electrode coupled at the first voltage supply node, and a trigger input of the SCR circuit coupled at the first current electrode of the second transistor.

2. The circuit of claim 1, further comprising a second diode having an anode electrode coupled at an input/output signal line and a cathode electrode coupled at the first node.

3. The circuit of claim 1, wherein the control electrode of the first transistor is coupled at the first voltage supply node by way of a first resistor.

4. The circuit of claim 1, wherein the body electrode of the first transistor and the control electrode of the first transistor are coupled at the first voltage supply node by way of a second resistor.

5. The circuit of claim 1, wherein the trigger input of the SCR circuit is coupled at the first current electrode of the second transistor by way of a third resistor.

6. The circuit of claim 1, wherein the first current electrode of the second transistor is coupled at a second voltage supply node by way of a fourth resistor.

7. The circuit of claim 6, further comprising a bias circuit coupled between the second voltage supply node and the first node.

8. The circuit of claim 1, wherein the first transistor is configured to cause the second transistor to turn on the during an ESD event.

9. The circuit of claim 8, wherein the second transistor is configured to conduct when turned on during the ESD event and cause the SCR circuit to trigger.

10. An electrostatic discharge (ESD) protection circuit comprising:
    a first transistor having a first current electrode coupled at a first node, a second current electrode, and a control electrode, the second current electrode and the control electrode coupled at a first voltage supply node;

a second transistor having a first current electrode, a second current electrode, and a control electrode, the control electrode coupled at a body electrode of the first transistor;

a diode having an anode electrode coupled at the first node and a cathode electrode;

a first bipolar junction transistor (BJT) having an emitter electrode coupled at the cathode electrode of the diode, a collector electrode coupled at the first voltage supply node, and a base electrode coupled at the first current electrode of the second transistor; and a second BJT having a collector electrode coupled at the base electrode of the first BJT, an emitter electrode and a base electrode of the second BJT coupled at the first voltage supply node.

11. The circuit of claim 10, wherein the base electrode is coupled at the first current electrode of the second transistor by way of a resistor.

12. The circuit of claim 10, further comprising a resistor having a first terminal coupled at the first current electrode of the second transistor and a second terminal coupled at the first node or a second voltage supply node.

13. The circuit of claim 10, further comprising a resistor having a first terminal coupled at the first voltage supply node and a second terminal coupled at the control electrode of the second transistor.

14. The circuit of claim 10, wherein the first BJT and the second BJT are configured to form a silicon-controlled rectifier (SCR) circuit, and wherein the base electrode of the first BJT is characterized as a trigger input of the SCR circuit.

15. The circuit of claim 14, wherein the second transistor is configured to turn on in response to an ESD event and cause the SCR circuit to trigger by way of the trigger input.

16. An electrostatic discharge (ESD) protection circuit comprising:

a first transistor having a first current electrode coupled at a first node, a second current electrode coupled at a first voltage supply node, and a control electrode coupled at the first voltage supply node by way of a first resistor;

a second transistor having a first current electrode, a second current electrode, and a control electrode, the control electrode coupled at a body electrode of the first transistor;

a second resistor having a first terminal coupled at the first voltage supply node and a second terminal coupled at the control electrode of the second transistor;

a first diode having an anode electrode coupled at the first node and a cathode electrode; and a silicon-controlled rectifier (SCR) circuit having an anode electrode coupled at the cathode electrode of the first diode, a cathode electrode coupled at the first voltage supply node, and a trigger input of the SCR circuit coupled at the first current electrode of the second transistor.

17. The circuit of claim 16, further comprising a second diode having an anode electrode coupled at an input/output signal line and a cathode electrode coupled at the first node.

18. The circuit of claim 16, further comprising a bias circuit coupled between a second voltage supply node and the first node.

19. The circuit of claim 18, further comprising a third resistor having a first terminal coupled at the first current electrode of the second transistor and a second terminal coupled at the second voltage supply node.

20. The circuit of claim 16, wherein the second transistor is configured to turn on in response to an ESD event and wherein the SCR circuit is configured to trigger based on the response of the second transistor.

* * * * *